US006976123B2

(12) United States Patent
Regev et al.

(10) Patent No.: US 6,976,123 B2
(45) Date of Patent: Dec. 13, 2005

(54) PRIORITY RESOLVER AND "NEAR MATCH" DETECTION CIRCUIT

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 342 days.

(21) Appl. No.: 10/330,208

(22) Filed: Dec. 30, 2002

(65) Prior Publication Data

US 2004/0128436 A1 Jul. 1, 2004

(51) Int. Cl.[7] .......................... G06F 12/00
(52) U.S. Cl. .......................... 711/108; 365/49
(58) Field of Search .......................... 711/108, 128; 365/49

(56) References Cited

U.S. PATENT DOCUMENTS 5,053,991 A * 10/1991 Burrows .......................... 365/49
6,510,509 B1 * 1/2003 Chopra et al. .......................... 712/13
6,591,317 B1 * 7/2003 Schzukin et al. .......................... 710/52
2003/0115426 A1 * 6/2003 Rosenbluth et al. .......................... 711/154

* cited by examiner

*Primary Examiner*—Nasser Moazzami

(57) ABSTRACT

An apparatus and method is disclosed for a CAM priority match detection circuit which determines a "near match" condition using a current-based decoder. The decoder uses n input lines and m complement lines to generate $2^n$ outputs, where the 2n outputs form a priority code for a given CAM word. The priority match detection circuit determines which CAM word or words out of a plurality of CAM words has the least amount of mismatching bits and prioritizes the CAM word or words in accordance with such determination.

57 Claims, 9 Drawing Sheets

| FIG. 4A |
|---|
| FIG. 4B |

PRIORITY RESOLVER AND "NEAR MATCH" DETECTION CIRCUIT

FIELD OF THE INVENTION

The present invention relates generally to semiconductor memory devices and, more particularly to priority resolvers, match detection and setting up multiple categories in a content addressable memory (CAM) device.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers, gateways and switches, computer systems and other devices that require rapid content searching, such as routing tables for data networks or matching URLs. Some of these tables are "learned" from the data passing through the network. Other tables, however, are fixed tables that are loaded into the CAM by a system controller. These fixed tables reside in the CAM for a relatively long period of time. A word in a CAM is typically very large and can be 96 bits or more.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has one or a pair of status bits that keep track of whether the location is storing valid information in it or is empty and available for writing.

Once information is stored in a memory location, it is found by comparing every bit in memory with data in the comparand register. When the contents stored in the CAM memory location does not match the data in the comparand register, the local match detection circuit returns a no match indication. When the contents stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which the desired data is stored or one of such addresses, if more than one address contained matching data. Thus, with a CAM, the user supplies the data and gets back the address if there is a match found in memory.

Conventional CAMs use priority encoders to translate the physical location of a searched pattern that is located to a number/address identifying that pattern. Typically, priority encoders are designed as a major block common to the whole device. Such a design requires conductors from virtually every word in the CAM to be connected to the priority encoder. Typically, a priority encoder consists of two logical blocks—a highest priority indicator and an address encoder.

A priority encoder is a device with a plurality of inputs, wherein each of the inputs has an assigned priority. When an input is received on a high priority line in a highest priority indicator, all of the inputs of a lesser priority are disabled, forcing their associated outputs to remain inactive. If any numbers of inputs are simultaneously active, the highest priority indicator will activate only the output associated with the highest priority active input, leaving all other outputs inactive. Even if several inputs are simultaneously active, the priority encoder will indicate only the activity of the input with the highest priority. The priority address encoder is used in the CAM as the means to translate the position (within the CAM) of a matching word into a numerical address representing that location. The priority address encoder is also used to translate the location of only one word and ignore all other simultaneously matching words. However, often times, there is a need to resolve the priority among multiple inputs, each having a different assigned priority.

CAMs are widely used in communication equipment for instantaneous search for certain patterns of data. In the search process, the comparand data is simultaneously compared to all the patterns stored in the CAM. The search looks for a perfect-match, i.e. on each and every bit, between the comparand and a pattern in the CAM. When a matching pattern is detected, the identity of the matching pattern within the CAM is provided. There are, however, other pattern recognition applications which require less than perfect-match between a comparand and a stored pattern. In many such applications, finding a "near-match" will suffice, wherein a "near-match" is defined as a case wherein a small number of bits in the pattern do not match the bits in a corresponding comparand. In such cases, there is a need to effectively resolve "imperfect" matches, that is, stored CAM words that may match only the majority of bits of the data in the comparand, but does not match every bit.

BRIEF SUMMARY OF THE INVENTION

In the present invention, data stored in each word in a CAM is compared with data in a comparand register on a bit for bit fashion. An error counter associated with each CAM word counts the number of mismatches between bits in the CAM word and respective bits in the comparand register. The present invention also describes a priority resolver which resolves the error counts in the error counters and gives a higher priority to CAM word in which the error count in the counter is the lowest.

An apparatus and method is also disclosed for a CAM priority match detection circuit which determines a "near match" condition using a current-based decoder. The decoder uses n input lines and m complement lines to generate $2^n$ outputs, where the 2n outputs form a priority code for a given CAM word. The priority match detection circuit determines which CAM word or words out of a plurality of CAM words has the least amount of mismatching bits and prioritizes the CAM word or words in accordance with such determination.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
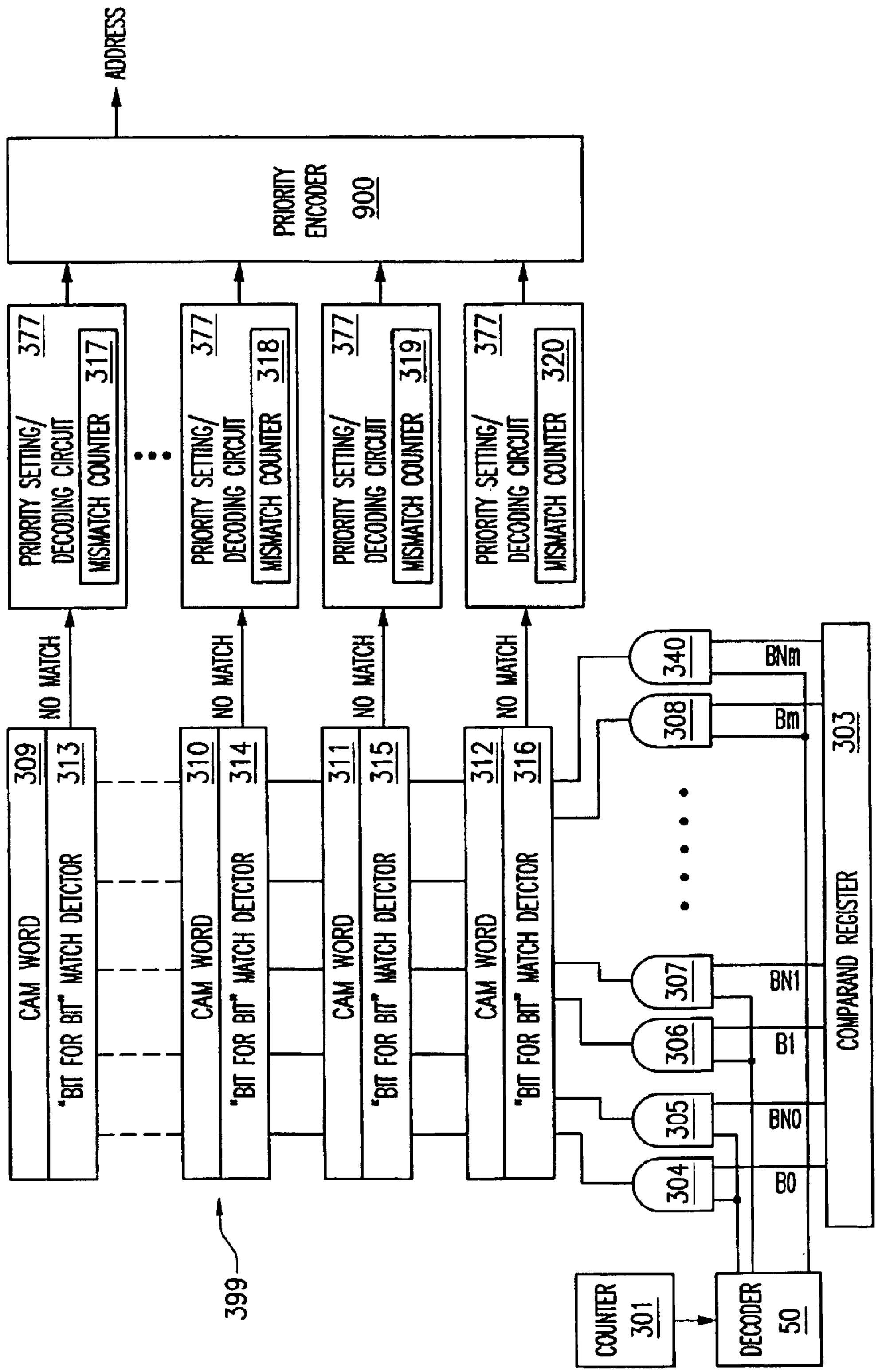
FIG. 1 illustrates a priority match detection circuit in accordance with an exemplary embodiment of the invention.

FIG. 1 illustrates an embodiment showing a priority match detection circuit 399, which searches every data pattern stored in the space of a CAM, and identifies all those data patterns that have a "near match" condition. The priority match detection circuit of FIG. 1 also determines which of the "near match" CAM words have the fewest mismatching bits.

A counter 301 inputs a sequential count into decoder 50, wherein the decoder receives a certain number of inputs from the counter and activates only one of the output lines, where each time the counter is incremented, a different output line of decoder 50 will be activated. Each output line of the decoder 50 is connected to an input of a respective AND gate (304–308 and 340). The other input of each AND gate is connected to a bit line (B0–Bm) or a complement bit line (BN0–BNm) connected to a comparand register 303, which stores search data.

As each output line from decoder 50 is activated, a logical AND operation is performed with the respective bit and complement bit from the comparand register 303. Since only one decoder output line is active at any time, only one bit and its complement bit from the comparand register 303 are available for matching.

The output from one pair of AND gates 304–308 & 340 is then sent to a plurality of CAM words (309–312) that have a respective "bit for bit" match detector (313–316) associated with each CAM word (discussed below in connection with FIG. 2). The output of a pair of respective AND gates will determine which one bit in each CAM word will undergo a bit-for-bit match detection with a corresponding bit in the comparand 303. The bit chosen for match detection will then be tested in parallel through every CAM word in the group while the remaining bits are masked (e.g., by the presence of a logic "0" at the remaining terminals of each respective AND gate (304–308)).

Figure 2:
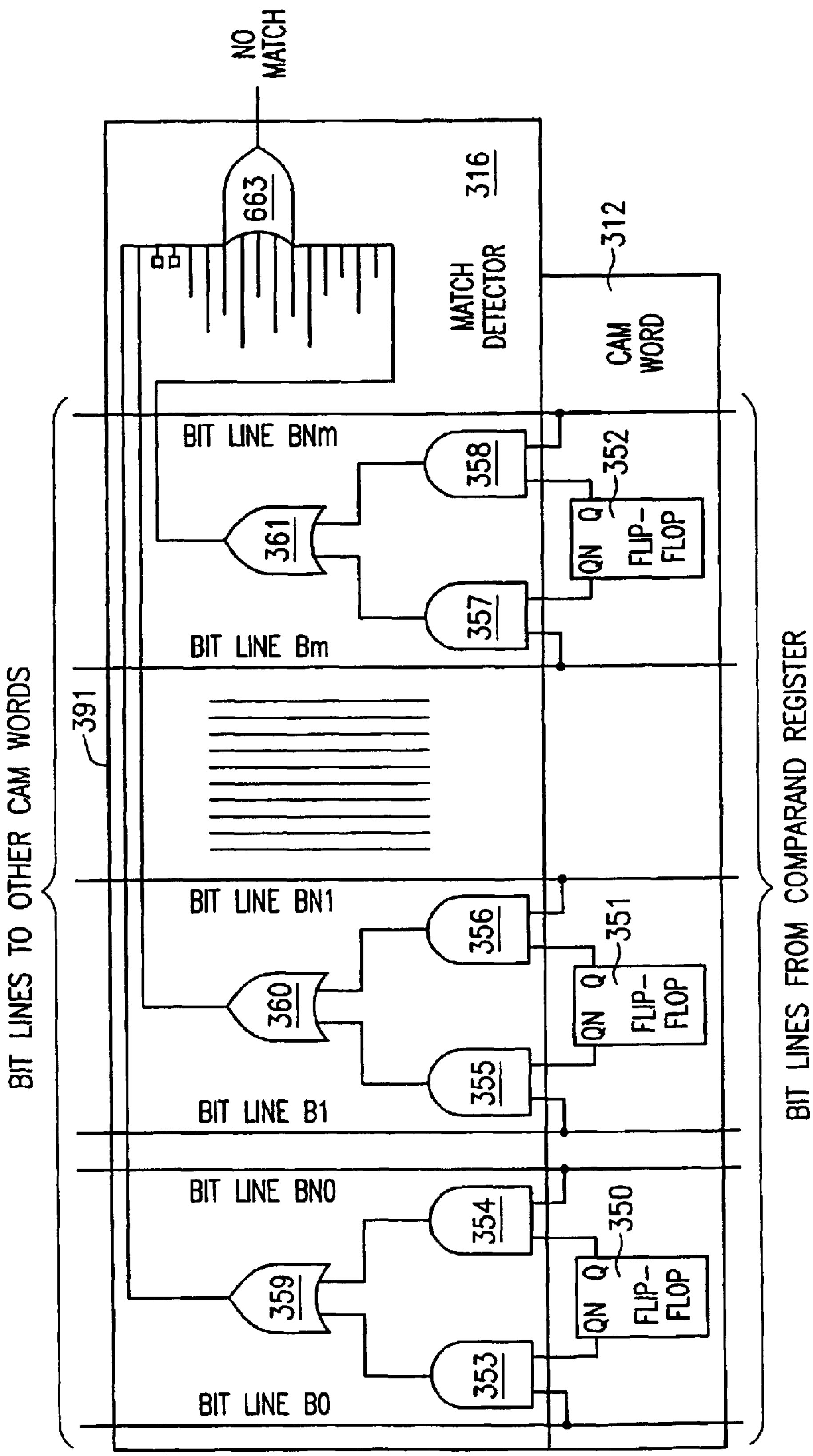
FIG. 2 illustrates a bit-for-bit match detection circuit used in the priority match detection circuit of FIG. 1.

FIG. 2 discloses in further detail the "bit for bit" match detector 316 for each CAM word 312. Each output from AND gates 304–308 & 340 is transmitted as bit lines (BIT LINE B0–BIT LINE Bm) which connect to other CAM words 391 at the same bit line location. The outputs from AND gates 304–308 & 340 are also connected to one input of an AND gate 353–358 in the match detector 316. Flip flops 350–352 are used as a memory device for each bit in the CAM word 312, wherein each output (Q) and complement (QN) is connected to a respective second input of the AND gates (353–358) as shown in FIG. 2. Each two AND gates associated with one bit (353–354, 355–356 & 357–358) are then connected to the inputs of a respective OR gate (359–361). The output of each OR gate 359–361 is then connected to an input terminal of an OR gate 663. This gate combination is used to compare the data stored in the CAM word 312 with the corresponding data stored in the comparand register 303. Each time any of the outputs of OR gates 359–361 are logic "1," OR gate 663 outputs a NO MATCH signal to a respective mismatch counter 317–320 (of FIG. 1).

The logic function generated by each group of gates 353–361 is an exclusive OR (EXOR) function $[(B_m{}^*QN_m)+(BN_m{}^*Q_m)]$. Whenever there is a mismatch, the Q output of a CAM word flip-flop will be the same as the respectively compared bit $BN_m$ from the comparand register 303, providing a logic "1" output on the respective OR gate (359–361). Conversely, if there is a match, then the output on the respective OR gate (359–361) will be a logic "0." If the outputs from all the OR gates 359–361 are "0," then there is a match between the unmasked bits in the comparand register 303 and the corresponding bits in the CAM word (e.g., 312).

Figure 3:
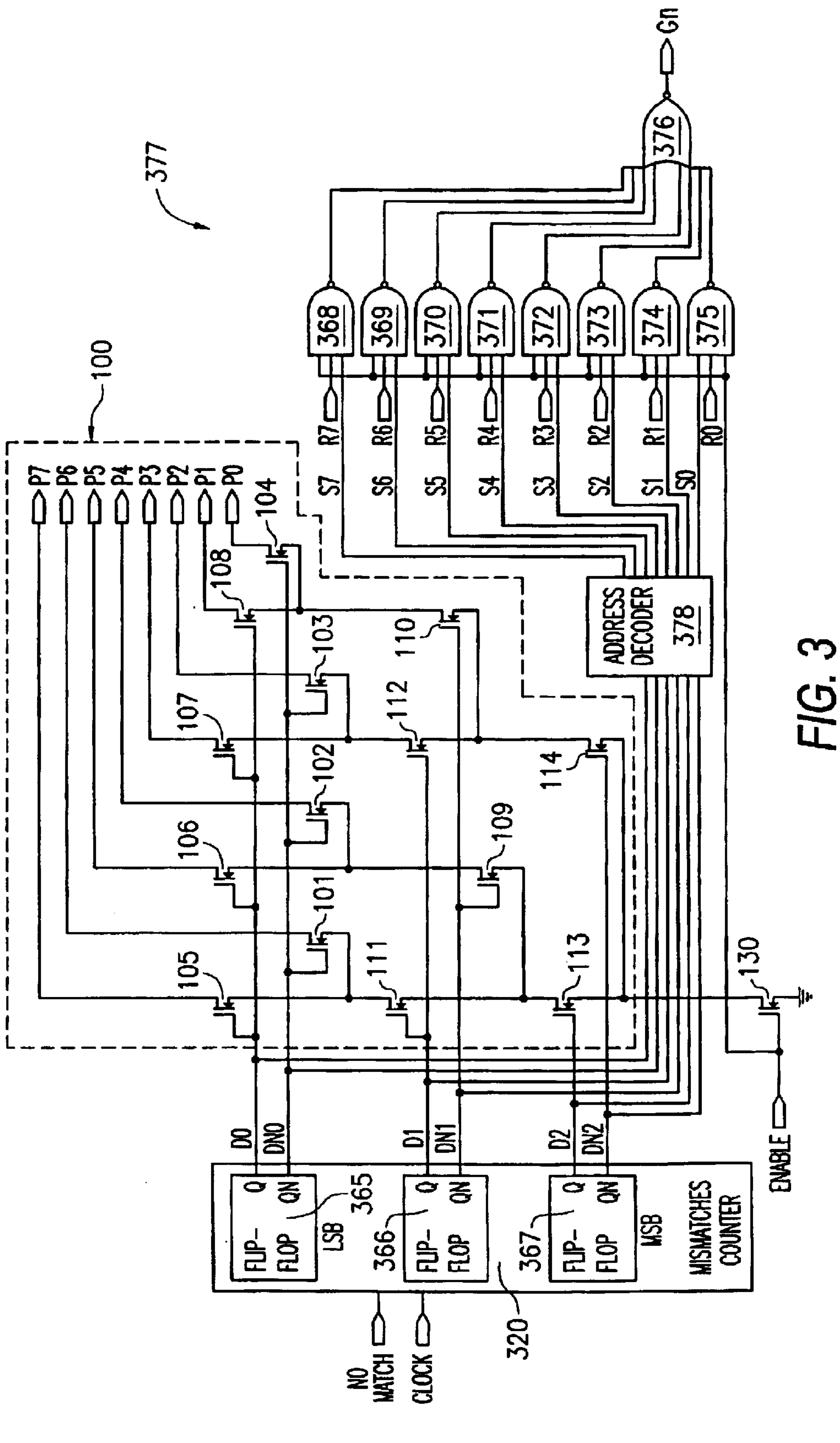
FIG. 3 illustrates a priority setting circuit used in the priority match detection circuit of FIG. 1.

The outputs of the OR gates 663 are coupled to the counters 320 in the priority setting/decoding circuits 377. Whenever a mismatching bit is detected in a CAM word during the "bit by bit" search, the "1" output on a gate 663 causes the counter 320 coupled to that gate to increment. Thus the count on each counter indicates the number of mismatching bits in the CAM word to which the said counter is associated FIG. 3 illustrates a priority setting circuit 377 used in the priority match detection circuit of FIG. 1. A separate priority setting circuit 377 is associated with each CAM word (309–312). Further, a mismatch counter 320, connected to current decoder 100 and address decoder 378, counts the number of mismatches detected within its associated CAM word (as described in connection with FIG. 2). Mismatch counter 320 comprises a plurality of flip-flops 365–367 that store the mismatch count for a corresponding CAM word (e.g., 312 of FIG. 1). Flip-flop 367 is configured as the "most significant bit" (MSB) and flip-flop 365 is configured as the "least significant bit" (LSB) as shown in FIG. 3. After a mismatch count is completed on a given CAM word being compared with comparand data, an ENABLE signal is transmitted, turning on transistor 130, which enables decoder circuit 100 and activates one terminal of AND gates 368–375.

The exemplary decoder 100 depicted in FIG. 3 is a 3×8 current-based decoder, where a priority input code comprising 3 bits (D0–D2) and their respective complements (DN0–DN2) is entered into the decoder 100, generating an 8-bit priority output code (P0–P7). It is understood that, while a 3×8 decoder is used in this exemplary embodiment, that any size decoder may be used having n complementary inputs, with associated m outputs, and $2^n$ outputs. Thus, the switching structure of decoder 50 can be described as using a set of switches activated by n data input line and their complements, such that for any combination of the n inputs a path for current flow is enabled to only one of the m output lines.

Still referring to FIG. 3, and with reference to the switching structure of the decoder 100, the least significant bit (LSB) of mismatch counter 320 is connected to 8-bit priority output code positions P0–P7 at $2^1$ intervals (intervals of two), i.e., second, fourth, sixth and eighth code P0–P7 positions, and so on. For the first complement line, switches will be offset by one column line ($2^{1-1}=2^0=1$) and will thus connect the complement data line to the code positions P0–P7 at the first, third, fifth, and seventh lines, and so on.

A 100% match between a data in the CAM word 312 and data in the comparand register 303 means that a zero count is stored in the counter 320. The fewer the mismatching bits in a CAM word 312, the smaller the count is in the counter 320 associated with that word. Since a low mismatch count indicates a closer match, counters are assigned a priority level based on the mismatch count present in the counter. The lower the count in the counter, the higher is the preference and the priority level. A count of zero has the highest priority, and the level of priority descends as the count is the counter increases.

As the significance of the bit of the mismatch counter 320 increases (from LSB to MSB), so does the interval at which the bit connects to the priority code lines P0–P7. Thus, the switches on the second least significant bit (D1) of mismatch counter 320 couple to the fourth (P3) and eighth (P7) positions of priority code bits P0–P7. Being that the offset is 2 (see above) for the second complement line, the switches therein connect to the second (P1) and sixth (P5) positions of priority code bits P0–P7. Likewise, the switch on the third MSB of mismatch counter 320 is coupled to every eighth ($2^3$) bit position of priority code bits P0–P7. The data complement line is offset by 4 ($2^{3-1}=2^2$), leaving the fourth bit (P3) to be connected to the data complement line of the MSB. The transistors that are coupled to the MSB data line and data complement line are coupled to ground.

Still referring to FIG. 3, the input line D0 of decoder 100 is connected to the gate terminal of n-type transistors 105–108. The drain terminals of transistors 105–108 are connected to the output lines P7, P5, P3 and P1 respectively. Similarly, complement line DN0 is connected to a respective gate terminal of n-type transistors 101–104. The drain terminal of transistors 101–104 are connected to output lines P6, P4, P2 and P0 respectively. Thus, if input D0 is logic "high," input DN0 will be logic "low." Accordingly, a voltage will be transmitted to the gates of transistors 105–108, while no voltage flows to the gates of transistors 101–104.

Input lines D1 and DN1 are connected to the gate terminals of n-type transistors 111–112 and 109–110, respectively, and input lines D2 and DN2 are connected to the gate terminals of n-type transistors 113 and 114, respectively. Each input line that transmits logic "high," will turn on the transistors having a gate terminal connected to that line, while input lines transmitting a logic "low" will turn off the transistors having a gate terminal connected to the line.

The transistors connected in series in the decoder 100 can be thought of as performing a logic AND function, while transistors connected in parallel perform a logical OR function. Thus, transistor 113 performs a logical AND function with transistors 111 and 109, wherein transistors 111 and 109 are performing a logic OR respective to each other. In turn, transistor 111 performs a respective logical AND with transistors 105 and 101, which perform a logical OR respective to each other, and so on.

Still referring to FIG. 3, as a first example, if an input "001" (D2=0, D1=0, D0=1) is transmitted to decoder circuit 100, the complement "110" (DN2=1, DN1=1, DN0=0) will also be transmitted from mismatch counter 320. Since lines D0, DN1, and DN2 are logic high (i.e., "1"), transistors 105–108, 109–110, and 114 will be turned on. Since the three series-connected transistors 114, 110, and 108 are conducting, output line P1 will be coupled to ground and a current will flow along the line connecting P1 and transistors 114, 110 and 108.

As a second example, if an input "110" (D2=1, D1=1, D0=0) is transmitted to the decoder circuit 100, the complement "001" (DN2=0, DN1=0, DN0=1) will be transmitted along with the original input. Since lines DN0, D1 and D2 are logic high (i.e., "1"), transistors 101–104, 111–112 and 113 will be turned on. Since the only current path open is the path along transistors 113, 111 and 101 (the only active transistors in the pathway to ground), output line P6 will transmit a current along the line. As will be described in greater detail below in connection with FIG. 4, each of the priority code positions P0–P7 are sensed to determine which one or ones are carrying current.

The mismatch counter 320 in FIG. 3 is initially reset before a count is started, wherein each NOMATCH signal received increments the counter by one. When the matching process of every bit in the CAM word 312 with every bit in the comparand 303 is completed, the ENABLE signal is triggered logic "high," allowing current to flow through one of the output bits of priority output code (P0–P7) of decoder 100. In this manner, a priority code or value is established for the CAM word depending on the number of mismatches detected. Generally, the greater the number of mismatches, the lower the priority signified by the code or value and vice versa.

Figures 4, 4A:
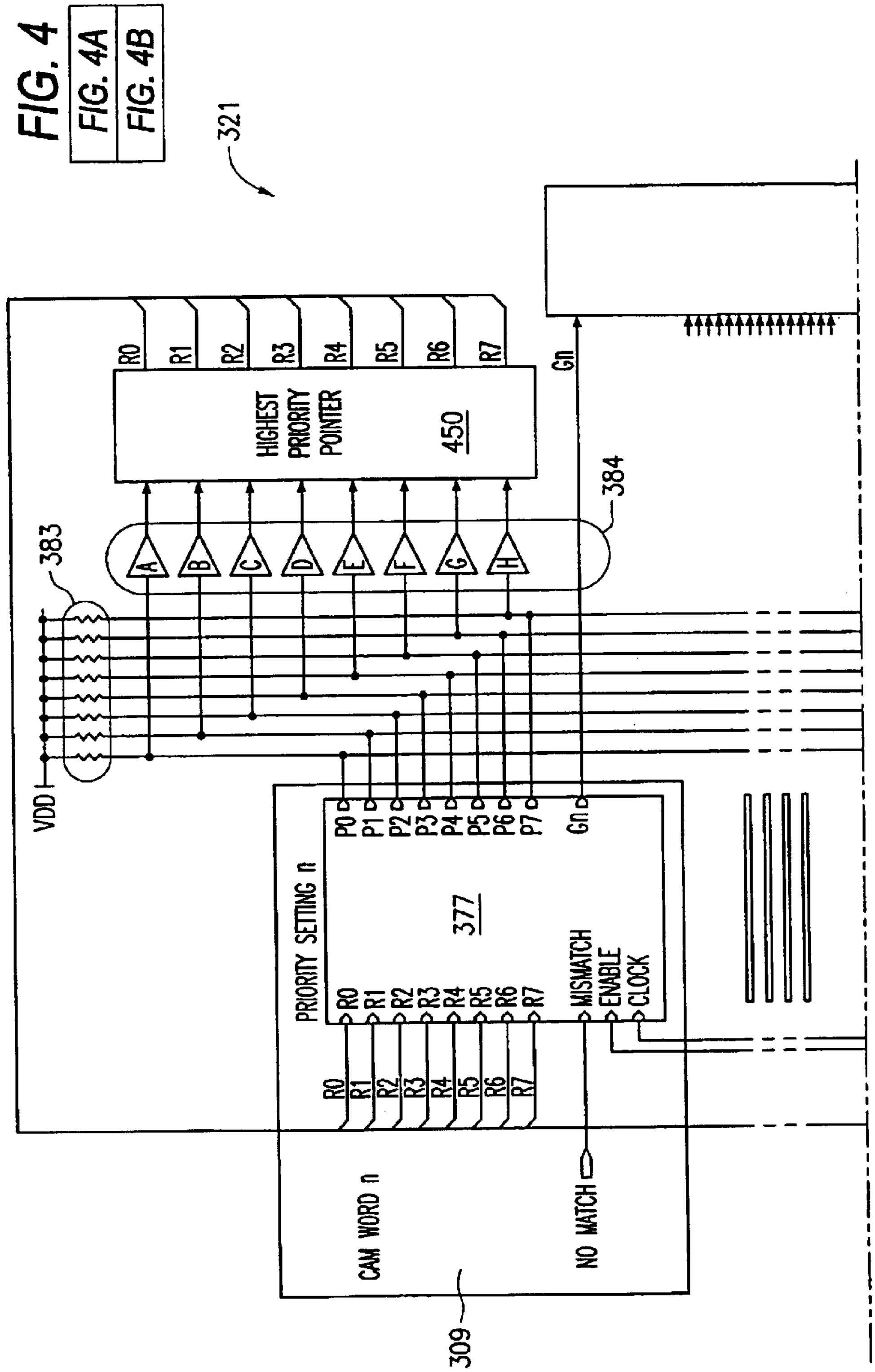
FIG. 4 illustrates a priority selection circuit used in the priority match detection circuit of FIG. 1.
Figure 4B:
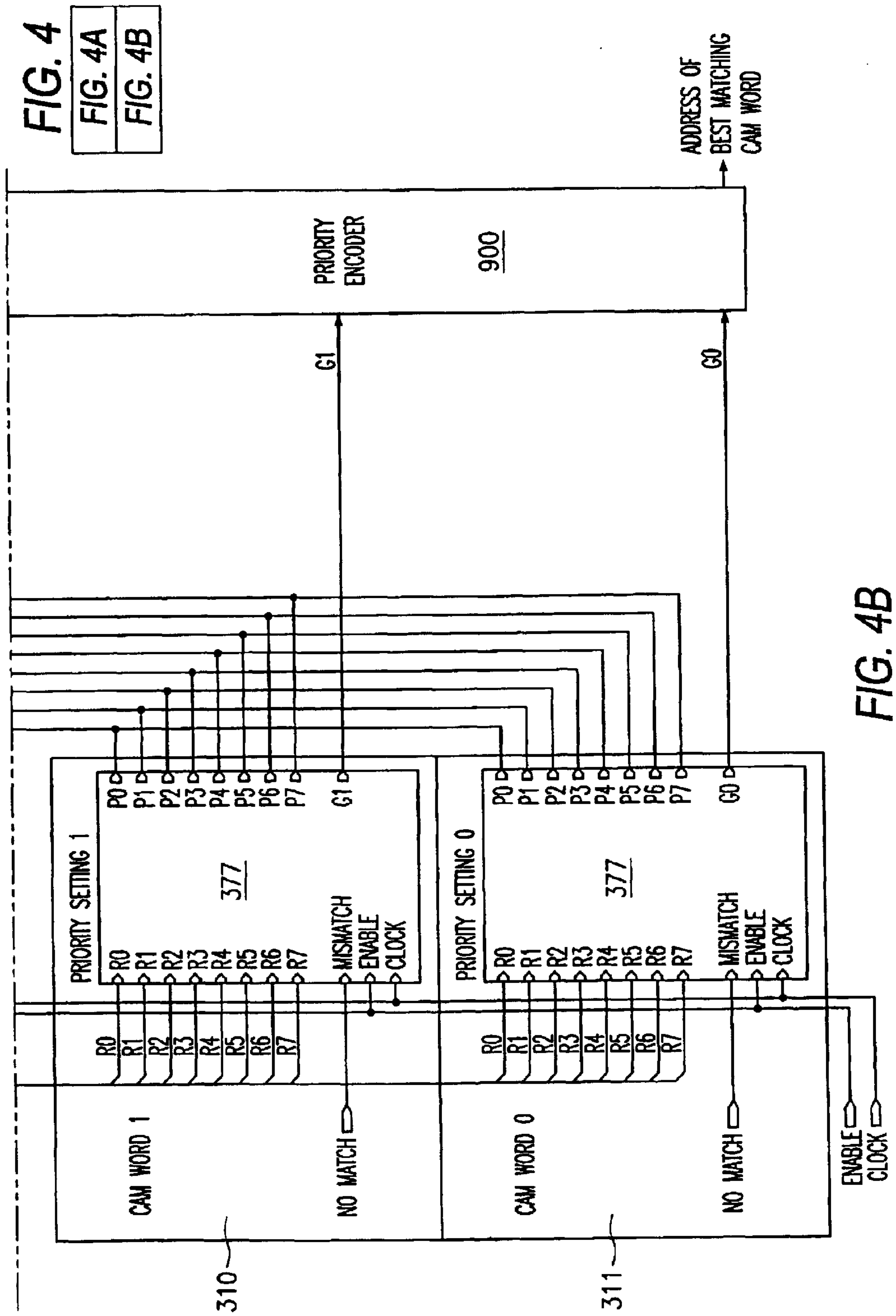

Turning to FIG. 4, a priority selection circuit 321 is disclosed, wherein each corresponding priority output bit (P0–P7) from each priority setting circuit 377 is coupled together to a respective pull-up resistor in resistor bank 383. Since the priority output bits are connected in parallel, current flowing through any of the priority output code bits (P0–P7) causes a voltage drop across a respective resistor 383. There can be a voltage drop across one resistor or any number of resistors simultaneously. Each resistor 383 is further connected to respective sense amplifiers 384A–H to sense the respective quantities of current flowing through the priority code bits P0–P7. The outputs of the sense amplifiers 384A–H are in turn connected to a highest priority pointer circuit 450.

FIG. 4 also depicts a priority signal (G0–Gn) from each CAM word 311–309 being forwarded to a priority encoder 900 which points to the address of the CAM word from the group of CAM words being searched, having the highest priority.

Figure 5:
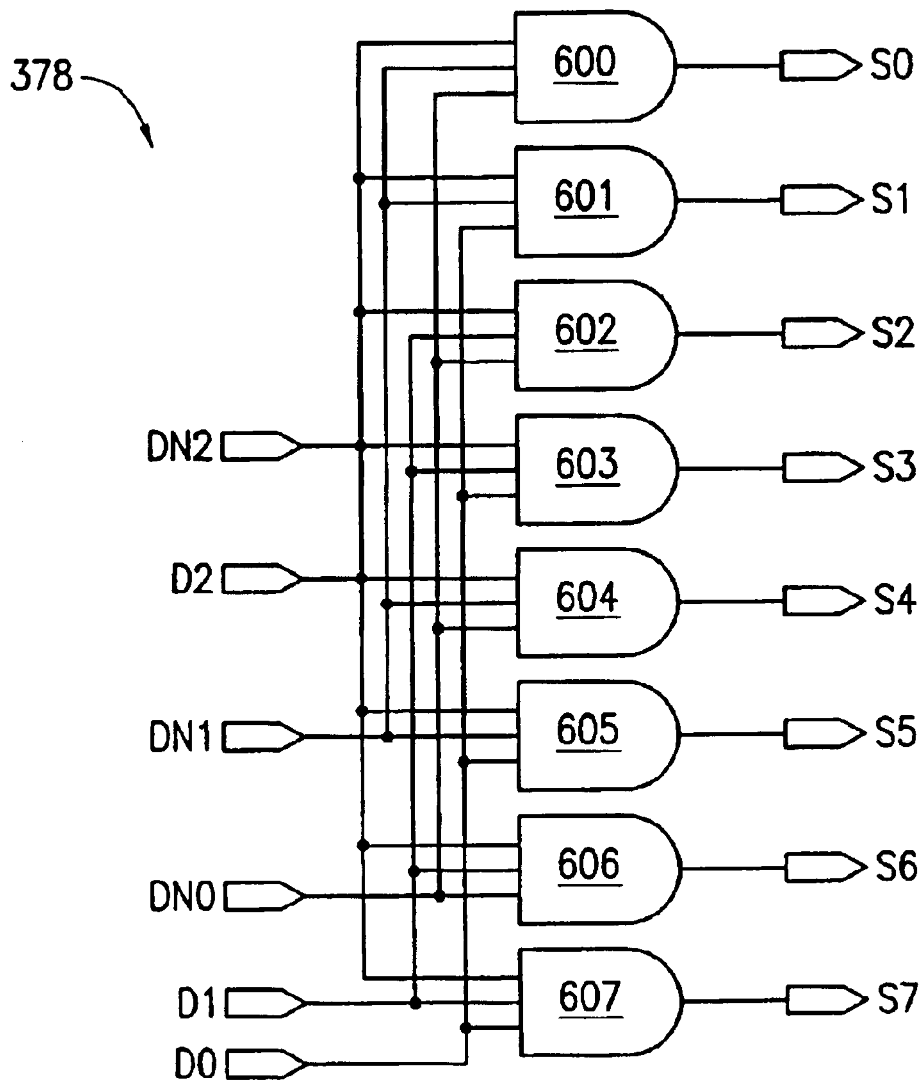
FIG. 5 illustrates an address decoder as used in the FIG. 3 priority setting circuit.

Turning now to FIG. 5, the address decoder 378 (of FIG. 3) is described in greater detail. Inputs D0–D2 and complement signals DN0–DN2 are input into logic AND gates 600–607, wherein AND gates 600–607 respectively output signals S0–S7. The outputs S0–S7 are determined by the following logical functions:

| |
|---|
| S0 = DN0 * DN1 * DN2 |
| S1 = D0 * DN1 * DN2 |
| S2 = DN0 * D1 * DN2 |
| S3 = D0 * D1 * DN2 |
| S4 = DN0 * DN1 * D2 |
| S5 = D0 * DN1 * D2 |
| S6 = DN0 * D1 * D2 |
| S7 = D0 * D1 * D2 |

Output signals S0–S7 are transmitted to a respective input on NAND gates 368–375 shown in FIG. 3, whose outputs are collectively NORed at gate 376. NOR gate 376 generates a priority signal Gn, as described above in connection with FIG. 4.

Figure 6:
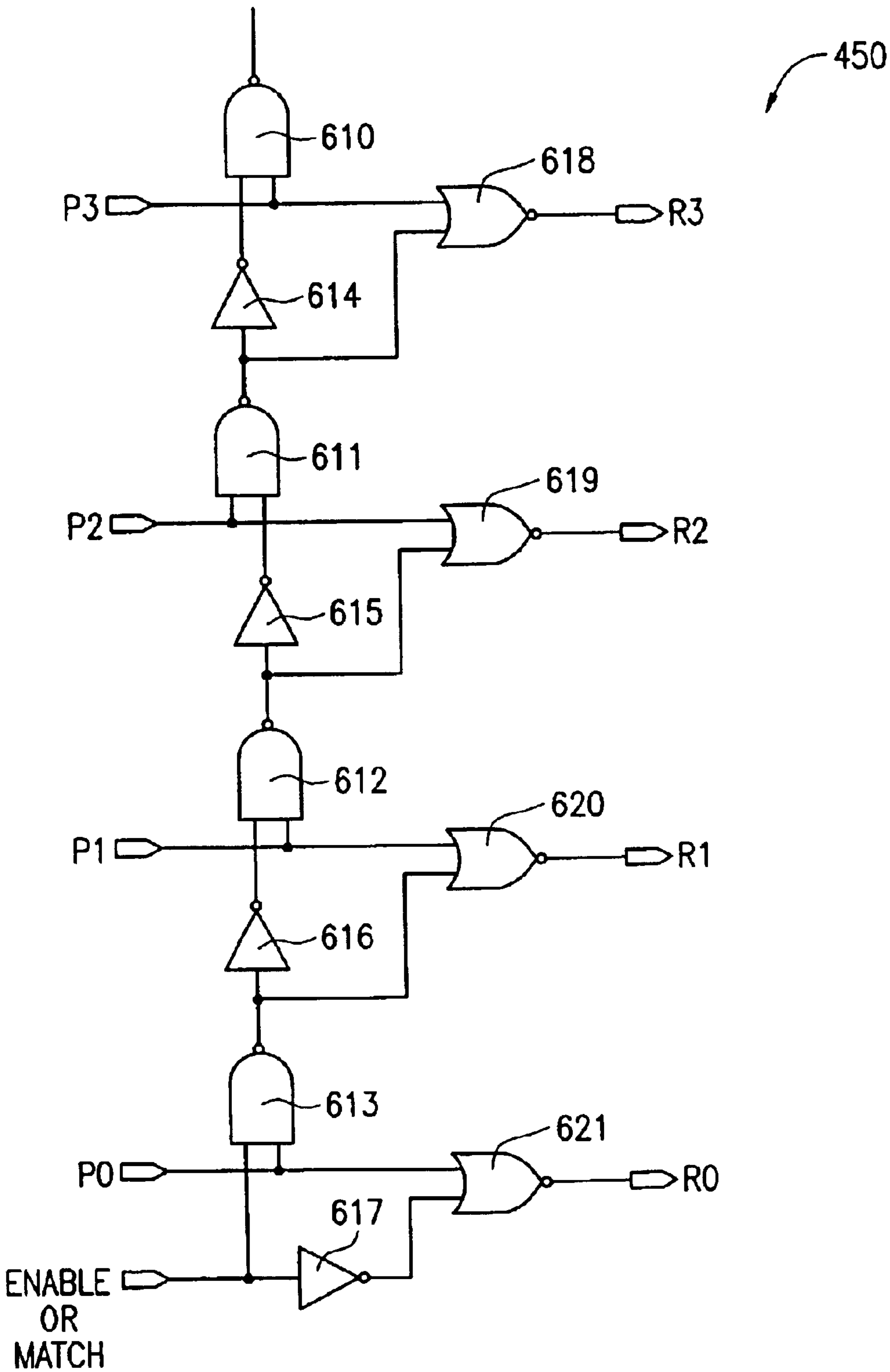
FIG. 6 illustrates a highest priority pointer as used in the FIG. 4 priority selection circuit.

Turning to FIG. 6, a portion of the highest priority pointer 450 (of FIG. 4) is described in greater detail. Each input line shown (P0–P3) is connected to an input terminal of NOR gates 618–621 and NAND gates 610–613. The output of each NAND gate 611–613 is shown as being inputted into a second terminal of NOR gates 618–620, respectively. The output of each NAND gate 611–613 is further inverted by inverters 614–616 and transmitted to adjacent NAND gates 610–613.

The pointer 450 points to the input having the highest priority active "low" input, with P0 being configured to have the highest priority, and inputs P1–Pn having a progressively lower priority. The logic configuration in the highest priority pointer 450 is set so that, no matter how many inputs are simultaneously active, the pointer will only output one line (R0–R3) as the active line (logic "1").

The output of the pointer 450 (R0–R7) is fed back to the priority setting circuit 377 in each CAM word (309–311; see FIGS. 3–4). As described previously in connection with FIG. 3, the outputs of mismatch counter 320 are also connected to decoder 378 that enables only one AND gate 368–375 to be active. As other inputs (R0–R7) to each AND gate 368–375 are input from the highest priority pointer 450, both the mismatch counter 320 and the highest priority pointer 450 will determine the one gate for output to gate 376 and output ($G_n$). Only the AND gates 368–375 having both inputs $S_n$ and $R_n$, at logic "1" will have a $G_n$ line active. Outputs $G_0$–$G_n$ from each CAM word are then inputted to a priority encoder 900 which establishes the address of the CAM word with the highest priority, which is also the CAM word with the nearest match.

Figure 7:
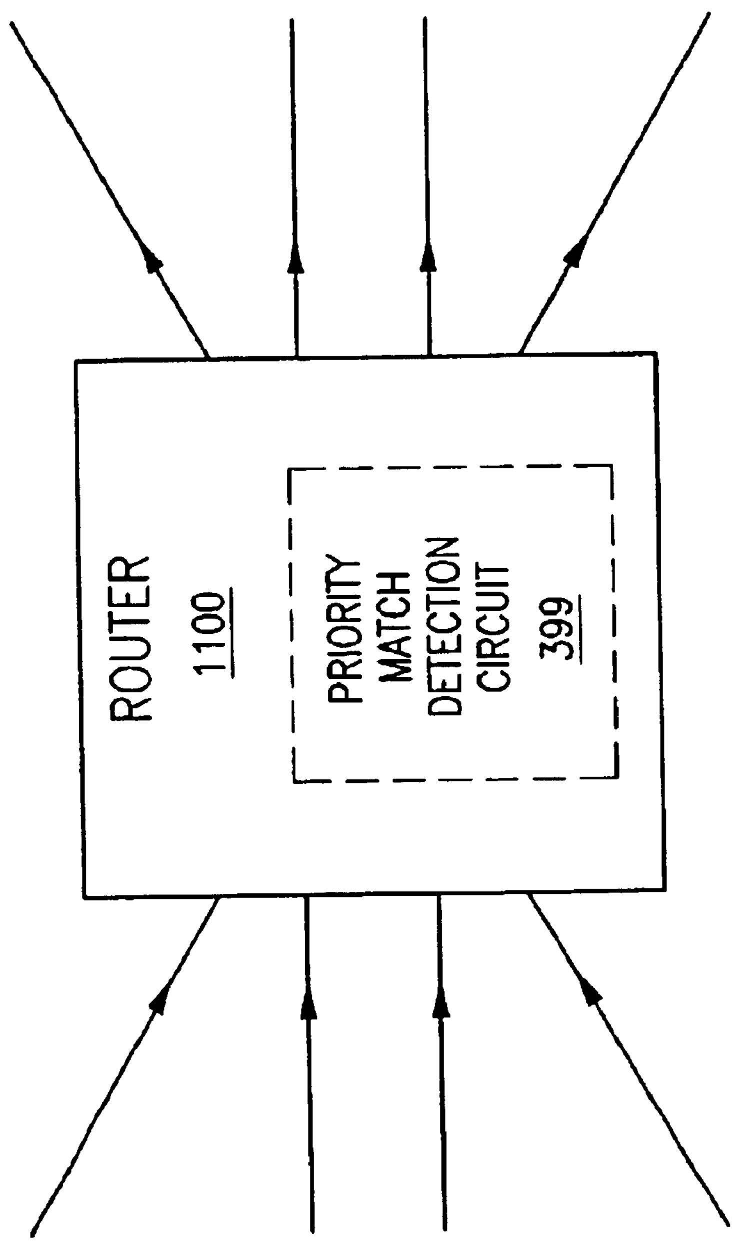
FIG. 7 depicts a simplified block diagram of a router employing the FIG. 1 priority match detection circuit in accordance with another exemplary embodiment of the invention.

FIG. 7 is a simplified block diagram of a router 1100 as may be used in a communications network, such as, e.g., part of the Internet backbone. The router 1100 contains a plurality of input lines and a plurality of output lines. When data is transmitted from one location to another, it is sent in a form known as a packet. Often times, prior to the packet reaching its final destination, that packet is first received by a router, or some other device. The router 1100 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 1100, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 7, router 1100 contains the added benefit of employing a semiconductor memory chip containing a priority match detection circuit, such as that depicted in connection with FIGS. 1–6. Therefore, the CAM has the benefit of providing "near match" detection and expanded pattern recognition, in accordance with an exemplary embodiment of the invention.

Figure 8:
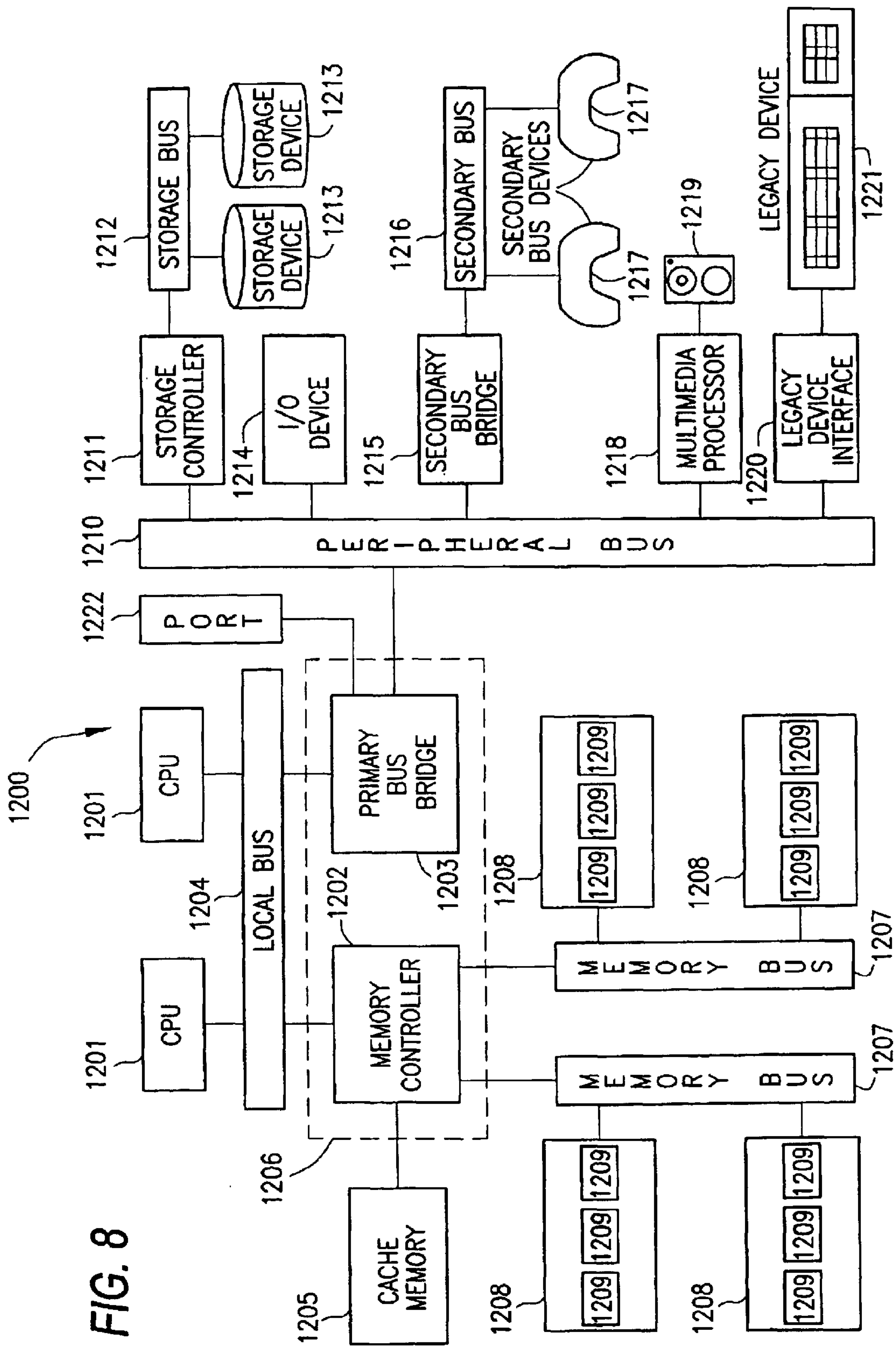
FIG. 8 depicts a block diagram of a processor system employing the FIG. 1 priority match detection circuit, in accordance with yet another exemplary embodiment of the invention.

FIG. 8 illustrates an exemplary processing system 1200 which utilizes a CAM priority match detection circuit such as that described in connection with FIGS. 1–6. The processing system 1200 includes one or more processors 1201 coupled to a local bus 1204. A memory controller 1202 and a primary bus bridge 1203 are also coupled the local bus 1204. The processing system 1200 may include multiple memory controllers 1202 and/or multiple primary bus bridges 1203. The memory controller 1202 and the primary bus bridge 1203 may be integrated as a single device 1206.

The memory controller 1202 is also coupled to one or more memory buses 1207. Each memory bus accepts memory components 1208. Any one of memory components 1208 may contain a CAM array performing priority match detection as described in connection with FIGS. 1–6.

The memory components 1208 may be a memory card or a memory module. The memory components 1208 may include one or more additional devices 1209. For example, in a SIMM or DIMM, the additional device 1209 might be a configuration memory, such as a serial presence detect (SPD) memory. The memory controller 1202 may also be coupled to a cache memory 1205. The cache memory 1205 may be the only cache memory in the processing system. Alternatively, other devices, for example, processors 1201 may also include cache memories, which may form a cache hierarchy with cache memory 1205. If the processing system 1200 include peripherals or controllers which are bus masters or which support direct memory access (DMA), the memory controller 1202 may implement a cache coherency protocol. If the memory controller 1202 is coupled to a plurality of memory buses 1207, each memory bus 1207 may be operated in parallel, or different address ranges may be mapped to different memory buses 1207.

The primary bus bridge 1203 is coupled to at least one peripheral bus 1210. Various devices, such as peripherals or additional bus bridges may be coupled to the peripheral bus 1210. These devices may include a storage controller 1211, a miscellaneous I/O device 1214, a secondary bus bridge 1215, a multimedia processor 1218, and a legacy device interface 1220. The primary bus bridge 1203 may also be coupled to one or more special purpose high speed ports 1222. In a personal computer, for example, the special purpose port might be the Accelerated Graphics Port (AGP), used to couple a high performance video card to the processing system 1200.

The storage controller 1211 couples one or more storage devices 1213, via a storage bus 1212, to the peripheral bus 1210. For example, the storage controller 1211 may be a SCSI controller and storage devices 1213 may be SCSI discs. The I/O device 1214 may be any sort of peripheral. For example, the I/O device 1214 may be a local area network interface, such as an Ethernet card. The secondary bus bridge may be used to interface additional devices via another bus to the processing system. For example, the secondary bus bridge may be a universal serial port (USB) controller used to couple USB devices 1217 via to the processing system 1200. The multimedia processor 1218 may be a sound card, a video capture card, or any other type of media interface, which may also be coupled to one additional device such as speakers 1219. The legacy device interface 1220 is used to couple legacy devices, for example, older styled keyboards and mice, to the processing system 1200.

The processing system 1200 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 1200 to become more suitable for use in a variety of applications. For example, many electronic devices which require processing may be implemented using a simpler architecture which relies on a CPU 1201 coupled to memory components 1208 and/or memory devices 1209. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of p-type and n-type transistors, the invention may be practiced with many other configurations without departing from the spirit and scope of the invention. In addition, although the invention is described in connection with flip-flop storage cells, it should be readily apparent that the invention may be practiced with any type of memory cell. It is also understood that the logic structures described in the embodiments above can be substituted with equivalent logic structures to perform the disclosed methods and processes. Accordingly, the invention is not limited by the foregoing description or drawings, but is only limited by the scope of the appended claims.

What is claimed as new and desired to be protected by Letters Patent of the United States is:

1. A circuit for detecting a near-match condition for a CAM, comprising:

a counter having an output count;

a decoder, having an input coupled to said output count;

an address decoder, having an input coupled to said output count;

a highest priority pointer, having an input coupled to an output of said decoder and having a plurality of priority output lines; and a plurality of logic gates, each of said logic gates having an input terminal coupled to an output of said address decoder and having another input coupled to one of said plurality of priority output lines from the highest priority pointer, said plurality of logic gates generating a priority signal for said CAM word.

2. The circuit according to claim 1, wherein the output count of said counter corresponds to a number of mismatching bits in said CAM word.

3. The circuit according to claim 1, wherein the decoder has n inputs, m complement inputs, and $2^n$ outputs, wherein the output lines represent bits of a priority code for said CAM word.

4. The circuit according to claim 3 wherein the address decoder has x inputs, y complement inputs, and $2^x$ outputs, wherein the address decoder circuit activates only one of said $2^x$ output lines after receiving an input from said counter, said $2^x$ output lines respectively being assigned an increasing level of priority.

5. The circuit according to claim 4, wherein the highest priority pointer identifies at least one of the outputs from said decoder having a logic "low" signal, said highest priority pointer outputting a pointer signal on one of said plurality of priority output lines.

6. The circuit according to claim 5, wherein one of said plurality of gates, receiving a pointer signal and an active address decoder output line, outputs a signal indicating a near match.

7. A method for determining a near match condition for a plurality of CAM words, said method comprising:

counting the number of mismatching bits associated with each CAM word;

setting a priority for each CAM word according to the count;

identifying at least one CAM word having the highest priority; and identifying the location of said at least one CAM word having the highest priority.

8. The method of claim 7, wherein the decoding is done through a decoder and an address decoder.

9. The method of claim 7, wherein the said act of setting comprises setting a highest priority for a CAM word having the lowest mismatch count.

10. A mismatch circuit for a CAM word, comprising:

a counter, providing a sequential count over n output terminals;

a decoder, connected to each of the n counter output terminals, said decoder having $2^n$ output terminals, wherein the decoder provides one active output terminal per each sequential count;

a masking circuit having a plurality of outputs, said masking circuit being connected to the decoder output terminals and to a plurality of bit lines from a comparand register, wherein the masking circuit allows only one comparand bit line to be active according to an active output terminal provided by the decoder;

a plurality of CAM words, connected to the plurality of outputs from the masking circuit in parallel; and a plurality of matching circuits respectively connected in parallel with said plurality of CAM words, wherein each matching circuit detects whether the bit line activated by the masking circuit matches a respective bit in each of the plurality of CAM words, and generates a signal on an output line if the bits do not match.

11. The mismatch circuit of claim 10, wherein the masking circuit comprises a plurality of logic gates, each of said gates having one input terminal coupled to a respective decoder output terminal, and a second terminal coupled to a comparand bit line.

12. The mismatch circuit of claim 11, wherein the comparand bit line includes a data bit line and a complement bit line.

13. The mismatch circuit of claim 10, wherein the CAM word includes a plurality of flip-flops storing data.

14. The mismatch circuit of claim 13, wherein the matching circuit further comprises at least one gate that performs an EXOR operation on each of the flip-flops with the comparand bit line.

15. The mismatch circuit of claim 14, wherein the matching circuit further comprises an OR gate that receives all the outputs of each of the gates that perform the EXOR operation.

16. The mismatch circuit of claim 15, wherein the matching circuit further comprises an NOR gate that receives all the outputs of each of the gates that perform the EXOR operation.

17. The mismatch circuit of claim 10, further comprising:
a plurality of mismatch counters, each of said plurality of counters being connected to a respective matching circuit, said mismatch counter being incremented by one each time a signal is received from the output line.

18. The mismatch circuit of claim 17, further comprising:
a plurality of priority setting circuits, each of said priority setting circuits being connected to each of n and m outputs of said mismatch counters, and each of said priority setting circuits providing $2^n$ outputs, wherein said priority setting circuit activates one of said $2^n$ outputs when receiving the output from said counter, and wherein each respective output of said $2^n$ outputs of each priority setting circuit is coupled together.

19. The mismatch circuit of claim 18, further comprising:
a plurality of resistors, each of said plurality of resistors being connected to a respective output of each said priority setting circuit, said resistors being further coupled to a supply voltage.

20. The mismatch circuit of claim 19, further comprising:
a plurality of sensing circuits, wherein each of said plurality of sensing circuits are connected to a respective output of each said priority setting circuit.

21. The mismatch circuit of claim 20, further comprising:
a highest priority pointer, receiving the inputs from each of said sensing circuits, said pointer feeding back $2^n$ outputs to each of the priority setting circuits, wherein one of said $2^n$ pointer outputs will be active according to the input from said sensing circuits.

22. The mismatch circuit of claim 21, wherein each of the priority setting circuits further comprises an address decoder coupled to the n outputs of said mismatch counter, said address decoder having $2^n$ outputs.

23. The mismatch circuit of claim 22, wherein the $2^n$ outputs from the address decoder are input to a plurality of logic gates, each of said plurality of logic gates having a terminal connected to one respective output from the address decoder.

24. The mismatch circuit of claim 23, wherein the plurality of logic gates each have a second terminal connected to a corresponding output of said $2^n$ pointer outputs.

25. The mismatch circuit of claim 24, wherein the plurality of logic gates each have a third terminal connected to an ENABLE line input.

26. The mismatch circuit of claim 25, wherein the outputs of the plurality of logic gates are all connected to the input of a priority logic gate, which outputs a main priority signal for each of the plurality of priority setting circuits.

27. The mismatch circuit of claim 26, further comprising a priority encoder, said encoder receiving the main priority signals from each of the plurality of priority setting circuits.

28. A method for determining a mismatching bit in a CAM, said method comprising:
providing a sequential count over n bit lines into a decoder having $2^n$ output bit lines;
transmitting a decoded signal voltage on one of said $2^n$ bit lines to a masking circuit;
processing the decoded signal voltage at the masking circuit to determine if the decoded signal voltage is equal to a voltage on a comparand bit line or a complement of the comparand bit line;
transmitting the voltage on said comparand bit line or complement bit line in parallel to a respective bit in a plurality of CAM words; and
detecting whether the respective bit in any of the CAM words matches the voltage present on said comparand bit line or complement bit line.

29. The method of claim 28, wherein the processing of the decoded signal to determine if the decoded signal voltage is equal to a voltage on a comparand bit line is accomplished by performing a logic function between the decoded voltage signal and the comparand bit line.

30. The method of claim 29, wherein the logic function is an AND function.

31. The method of claim 29, wherein the processing of the decoded signal to determine if the decoded signal voltage is equal to a voltage on a complement of the comparand bit line is accomplished by performing a logic function between the decoded voltage signal and the complement of the comparand bit line.

32. The method of claim 31, wherein the logic function is an AND function.

33. The method of claim 31, wherein the detecting whether the respective bit in any of the CAM words matches the voltage present on said comparand bit line or complement bit line is accomplished by performing a logic function among the CAM word bit, the comparand bit line and the complement of the comparand bit line.

34. The method of claim 33, wherein the logic function is an EXOR function.

35. The method of claim 33, wherein a NOMATCH signal is transmitted to a counter if a bit does not match, said counter incrementing a count each time a NOMATCH signal is received.

36. The method of claim 34, wherein the final count of the counter is decoded and processed to generate data that identifies at least one CAM word that has the highest or lowest count.

37. The method of claim 36, wherein the data is processed with each CAM word to identify at least one address of the at least one CAM word having the highest or lowest count.

38. A circuit for setting the priority of CAM data, comprising:
a plurality of mismatch counters, each of said plurality of mismatch counters receiving a mismatch count from a matching circuit coupled to a CAM word, said mismatch counters each having n outputs and m complement outputs; and
a plurality of priority setting circuits, each of said priority setting circuits being connected to each of the n and m outputs of said mismatch counters, and each of said priority setting circuits providing $2^n$ outputs, wherein said priority setting circuit activates one of said $2^n$ outputs when receiving the output from said counter, and wherein each respective output of said $2^n$ outputs of each priority setting circuit is coupled together in parallel.

39. The mismatch circuit of claim 38, further comprising:
a plurality of resistors, each of said plurality of resistors being connected to a respective output of each said priority setting circuit, said resistors being further coupled to a supply voltage.

40. The mismatch circuit of claim 39, further comprising:
a plurality of sensing circuits, wherein each of said plurality of sensing circuits are connected to a respective output of each said priority setting circuit.

41. The mismatch circuit of claim 40, further comprising:
a highest priority pointer, receiving the inputs from each of said sensing circuits, said pointer feeding back $2^n$ outputs to each of the priority setting circuits, wherein one of said $2^n$ pointer outputs will be active according to the input from said sensing circuits.

42. The mismatch circuit of claim 41, wherein each of the priority setting circuits further comprises an address decoder coupled to the n outputs of said mismatch counter, said address decoder having $2^n$ outputs.

43. The mismatch circuit of claim 42, wherein the $2^n$ outputs from the address decoder are input to a plurality of logic gates, each of said plurality of logic gates having a terminal connected to one respective output from the address decoder.

44. The mismatch circuit of claim 43, wherein the plurality of logic gates each have a second terminal connected to a corresponding output of said $2^n$ pointer outputs.

45. The mismatch circuit of claim 44, wherein the plurality of logic gates each have a third terminal connected to an ENABLE line input.

46. The mismatch circuit of claim 45, wherein the outputs of the plurality of logic gates are all connected to the input of a priority logic gate, which outputs a main priority signal for each of the plurality of priority setting circuits.

47. The mismatch circuit of claim 46, further comprising a priority encoder, said encoder receiving the main priority signals from each of the plurality of priority setting circuits.

48. A method for setting a priority for a plurality of CAM words, said method comprising:

receiving a count from a match detector;

resolving the count to indicate a priority code for at least one CAM word from said plurality of CAM words; and processing the priority code to determine at least one address location for the at least one CAM word, wherein the act of resolving the count further includes decoding the count to determine a priority signal, said priority signal corresponding to at least one CAM word having the least amount of mismatching bits.

49. The method according to claim 48, wherein the priority signal is transmitted to and processed by a highest priority pointer.

50. The method according to claim 49, wherein the output of the highest priority pointer is processed along with the count from the match detector to create a main priority output signal.

51. The method according to claim 50, wherein a priority resolver determines the at least one address location for the at least one CAM word according to the main priority output signal.

52. A processing system, comprising:

a processing unit;

a memory component coupled to said processing unit, said memory component containing a near-match detection circuit for a plurality of content addressable memories (CAMs), said near match detection circuit comprising:

a counter having an output count;

a decoding circuit, having an input coupled to said output count;

an address decoding circuit, having an input coupled to said output count;

a highest priority pointer circuit, having an input coupled to an output of said decoding circuit; and a plurality of gates, each of said gates having an input terminal coupled to an output of said address decoding circuit and having another input coupled to one of a plurality of output lines from the highest priority pointer circuit.

53. The circuit according to claim 52, wherein the counter stores a count of mismatching bits in a CAM word.

54. The circuit according to claim 53, wherein the decoder circuit has n inputs, m complement inputs, and $2^n$ outputs, wherein the decoder circuit activates only one of said $2^n$ output lines after receiving an input from said counter, said $2^n$ output lines respectively being assigned an increasing level of priority.

55. The circuit according to claim 53 wherein the address decoder circuit has n inputs, m complement inputs, and $2^n$ outputs, wherein the decoder circuit activates only one of said $2^n$ output lines after receiving an input from said counter, said $2^n$ output lines respectively being assigned an increasing level of priority.

56. The circuit according to claim 55 wherein the highest priority pointer identifies at least one of the output lines, having the highest assigned priority, which has a logic "low" signal, and outputs a pointer signal on one of said plurality of output lines.

57. The circuit according to claim 56, wherein one of said plurality of gates, receiving a pointer signal and an active address decoder line, outputs a signal indicating a near match.

* * * * *

UNITED STATES PATENT AND TRADEMARK OFFICE

CERTIFICATE OF CORRECTION

PATENT NO. : 6,976,123 B2
DATED : December 13, 2005
INVENTOR(S) : Alon Regev et al.

It is certified that error appears in the above-identified patent and that said Letters Patent is hereby corrected as shown below:

Column 2,
Line 56, "to CAM" should read -- to the CAM --;

Column 4,
Line 50, "associated" should read -- associated. --;

Column 5,
Line 33, "count in" should read -- count is --;

Column 8,
Line 18, "coupled the" should read -- coupled to the --;

Column 9,
Line 2, "via to the" should read -- via the --; and

Column 11,
Line 2, "an NOR" should read -- a NOR --.

Signed and Sealed this

Twenty-fifth Day of April, 2006

JON W. DUDAS
*Director of the United States Patent and Trademark Office*